United States Patent [19]

Hamasaki

[11] Patent Number: 5,068,736
[45] Date of Patent: Nov. 26, 1991

[54] SOLID STATE IMAGING DEVICE WHICH HAS A SHORT TIME CONSTANT WHICH IS SHORTER THAN THE APPLICATION OF A PULSE VOLTAGE UNTIL THE END OF THE BLANKING PERIOD

[75] Inventor: Masaharu Hamasaki, Kanagawa, Japan

[73] Assignee: Sony Corporation, Tokyo, Japan

[21] Appl. No.: 407,740

[22] Filed: Sep. 15, 1989

[30] Foreign Application Priority Data

Sep. 20, 1988 [JP] Japan .................. 63-235445

[51] Int. Cl.$^5$ ............................................. H04N 5/335
[52] U.S. Cl. .......................... 358/213.3; 358/213.15; 357/24
[58] Field of Search ............... 358/213.11, 213.19, 358/213.12, 213.13, 213.16, 213.15, 213.31, 228, 483; 357/24, 24 LR, 30 I, 22 R, 41, 24 M

[56] References Cited

U.S. PATENT DOCUMENTS

| 4,443,818 | 4/1984 | Ohba et al. ............... 358/213.11 |
| 4,504,848 | 3/1985 | Matsumoto et al. .......... 357/24 |
| 4,554,675 | 11/1985 | Miwada ..................... 377/60 |
| 4,611,221 | 9/1986 | Imai et al. |
| 4,630,091 | 12/1986 | Kuroda et al. .............. 357/30 |
| 4,717,945 | 1/1988 | Yusa et al. ................. 357/24 |
| 4,875,100 | 10/1989 | Yonemoto et al. ........... 358/213.19 |

FOREIGN PATENT DOCUMENTS 59-65470  4/1984  Japan ........................ 357/24

OTHER PUBLICATIONS

PCT Application WO 88/02186.
IEEE Transactions On Electron Devices, vol. ED-33, No. 4, Apr. 1986.

Primary Examiner—Victor R. Kostak
Assistant Examiner—Safet Metjahic

[57] ABSTRACT

The present invention is concerned with a solid state imaging device wherein a pulse voltage is applied to a semiconductor substrate to carry out an electronic shuttering operation in a blanking period. An output circuit comprising a MIS transistor formed in a well region on the semiconductor substrate. The impurity concentration and the junction depth of the well region are set so that a time constant determined by parasitic capacitances and resistances of the well region becomes shorter than the period which elapses since the application of the pulse voltage until the expiration of the blanking period, to suppress fluctuations in the level or gain of the MIS transistor due to the pulse voltage to prevent adverse effects on the output signals.

5 Claims, 4 Drawing Sheets

SOLID STATE IMAGING DEVICE WHICH HAS A SHORT TIME CONSTANT WHICH IS SHORTER THAN THE APPLICATION OF A PULSE VOLTAGE UNTIL THE END OF THE BLANKING PERIOD

BACKGROUND OF THE INVENTION (1) Field of the Invention

This invention relates to a solid state imaging device, such as charge coupled device (CCD) imager, performing electrical shuttering on application of a pulse voltage to a substrate.

(2) Description of the Prior Art

In some of the solid state imaging devices, the output circuit has its source follower constituted by MOS transistors.

FIG. 5 shows the diagrammatic cross-section of the output circuit of the solid state imaging device. Briefly, a p-type well region 52 is formed on an n-type silicon substrate 51 fed with a substrate voltage $V_{sub}$. On the surface of the p-type well region 52, there are formed a channel stop region 53, a source drain region 54 fed with a ground voltage $V_{ss}$, a source drain region 55 for taking out an output voltage $V_{OUT}$, and a source drain region 56 fed with a power source voltage $V_{dd}$. Gate electrodes 57 and 58 are formed on channel-forming regions 59 and 60 between the adjacent source drain regions 54 to 56. Thus the source drain regions 54, 55 and the gate electrode 57 fed with a constant voltage $V_{GG}$ make up a load transistor while the source drain regions 55, 56 and the gate electrode 58 fed with an input voltage $V_{in}$ make up a driving MOS which is a field effect transistor. The p-type well region 52 has the junction depth of ca. 10 μm and the surface impurity concentration of $1 \times 10^{15}$ to $10^{16}$ cm$^{-2}$.

In the above described solid state imaging device, there exist parasitic capacitance between each of the source drain regions 54 to 56 and the well region 52 or between the well region 52 and the substrate 51. There are also holes h in deeper portions of the p-type well region, as shown in FIG. 6. The region of these holes h present a larger resistance because the impurity concentration and the hole mobility are both low.

FIG. 7 shows an equivalent circuit of the output circuit of the solid state imaging device. By the resistance component of the holes h, resistances $r_{11}$ to $r_{16}$ are formed equivalently in the well region 52, whereas there are parasitic capacitances $C_{11}$ to $C_{15}$ between the substrate and the well and parasitic capacitances $C_{21}$ to $C_{25}$ between the well region and each electrode.

When electronical shuttering is performed with the use of the well region where there are the parasitic capacitances $C_{11}$ to $C_{15}$ and $C_{21}$ to $C_{25}$ and resistance $r_{11}$ to $r_{16}$ under application of a pulse voltage to the substrate, the pulse response waveform becomes blunt due to these capacitances and resistances. More specifically, electronic shuttering is usually performed by sweeping out useless electrical charges from the pixels to the substrate during the horizontal or vertical blanking periods, depending on the shuttering speed. Should the time constants defined by the parasitic capacitances $C_{11}$ to $C_{15}$ and $C_{21}$ to $C_{25}$ and by the resistances $r_{11}$ to $r_{16}$ exceed the horizontal (H) blanking period, the pulse voltage affects the output circuit to give rise to gain change or level fluctuations at the driving MOS field effect transistor to affect the produced image.

SUMMARY OF THE INVENTION

In view of the above mentioned technical difficulties, it is an object of the present invention to provide a solid state imaging device which will prevent adverse effects on the output circuit at the time of the electronic shuttering operation.

The solid state imaging device of the present invention is adapted to carry out an electronic shuttering operation on application of a pulse voltage to the first conductivity type semiconductor substrate. The MIS field effect transistor at the output circuit is so designed that a first conductivity type channel is formed in a second conductivity type semiconductor region on the semiconductor substrate. The second conductivity type semiconductor region has an impurity concentration and a depth of junction such that the time constant determined by the resistance and the parasitic capacitance of the second conductivity type semiconductor region will become shorter than the time period which elapses since the application of the pulse voltage until the expiration of the blanking period.

The above mentioned impurity concentration and the junction depth of the second conductivity type semiconductor region may be optionally selected as a function of the impurity concentration of the substrate, substrate voltage, pulse voltage applied to the substrate, the pulse timing during the blanking period, characteristics of the MIS transistors or the like. For example, the impurity concentration or the depth of junction may be selected to render all or part of the second conductivity type semiconductor region into a depletion layer. The second conductivity type semiconductor region may have an impurity concentration and a depth of junction different from those of the well region of the imaging area.

In the solid imaging device of the present invention, it is possible to suppress fluctuations in level or gain of the MIS transistor at the output circuit to prevent adverse effects on output signals accompanying pulse application to the substrate at the time of the electronic shuttering.

DETAILED DESCRIPTION OF THE INVENTION

In the present illustrative embodiment, a longitudinal overflow drain type CCD imager having an electronic shuttering function is explained, in which useless electrical charges are eliminated in the longitudinal direction by application of a pulse voltage to the substrate during the horizontal blanking period. The CCD imager of the illustrative embodiment features a specific structure of the well in its output circuit.

Figure 1:
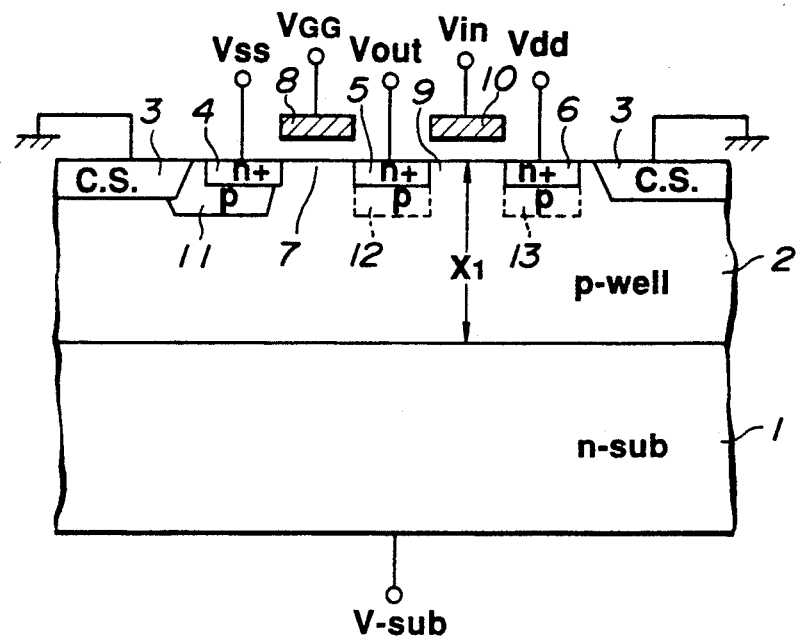
FIG. 1 is a schematic sectional view showing essential parts of a solid state imaging device of the present invention.

FIG. 1 shows the output circuit in a cross-sectional view, in which a p-type well region 2 is formed on an n-type silicon substrate 1. A pulse voltage of, for example, 30 V, is applied to the n-type silicon substrate 1 to sweep out the useless charges in an imaging part, not shown. The p-type well region 2 is reserved for forming nMOS field effect transistors on its major surface, and has such impurity concentration and junction depth that the time constant determined by the resistances and the parasitic capacitance of the p-type well region 2 becomes shorter than the time which elapses since application of the pulse voltage until expiration of the blanking period. Thus the junction depth $x_1$ is shorter than in the conventional device and is of the order of 5 μm, whereas the impurity concentration on the surface of the well region has a lower value of $10^{15}$ cm$^{-2}$.

On the surface of the p-type well region 2, which has the shallower depth of junction $x_1$ and the lower impurity concentration, the channel stop region 3 maintained at a predetermined potential is formed for encircling an area on the well region 2. In this area encircled by the channel stop region 3, there are formed a source drain region 4, fed with a voltage $V_{ss}$ of ca. 2 V, a source drain region 5 connecting to the next stage follower to output a voltage $V_{OUT}$ and a source drain region 6 fed with a voltage $V_{dd}$ of ca. 15 V. A gate electrode 8 is formed on a channel-forming region 7 between the source drain regions 4 and 5 via an insulating layer, and is fed with a voltage $V_{GG}$. The nMOS field effect transistor including this channel forming region 7 functions as an active load. On the channel-forming region 9 between the source drain regions 5 and 6, a gate electrode 10 is formed via an insulating layer, and is fed with an output signal $V_{IN}$ from the preceding stage. The nMOS field effect transistor including this channel-forming region 9 functions as a driving nMOS field effect transistor. Because of the above described impurity concentration and depth of junction $x_1$, the region directly below the driving nMOS field effect transistor is completely depleted to result in prevention of adverse effects on the output signal.

Below the source drain regions 4, 5, 6, there are formed p$^+$ type second well regions 11, 12, 13, respectively. The p$^+$ type second well region 11 is aimed at lowering the values of resistances $r_1$ and $r_2$ of FIG. 4, as later described, whereas the p$^+$ type second well regions 12, 13 are formed for assuring the punch through withstand voltage between the source drain regions 4 to 6 and the substrate 1. It is because the junction of depth $x_1$ and the impurity concentration of the p-type well region 2 are selected to have lower values in the solid state imaging device of the illustrative embodiment. Should the withstand voltage be assured, there is no necessity providing the p$^+$ type second well regions 12, 13.

Figure 2:
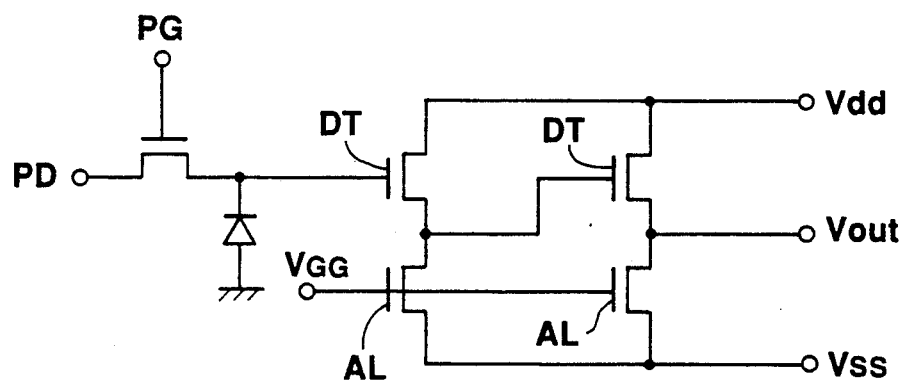
FIG. 2 is a circuit diagram showing essential parts thereof.

FIG. 2 shows a wiring connection of the output circuit, to which a signal from a photodiode PD is supplied via a gate PG. The output signal of the CCD is issued via two source follower stages, each consisting of a series connection of an active load AL and a driving MOS field effect transistor DT, as shown in FIG. 1.

Figure 3:
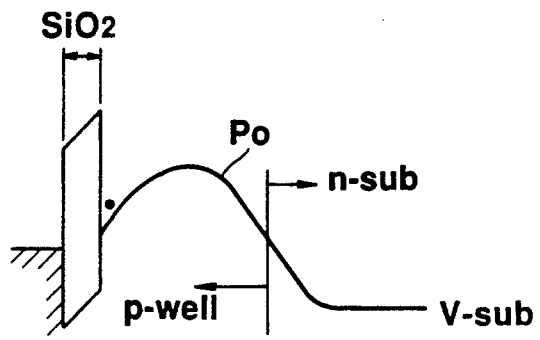
FIG. 3 shows the potential at the essential parts.
Figure 6:
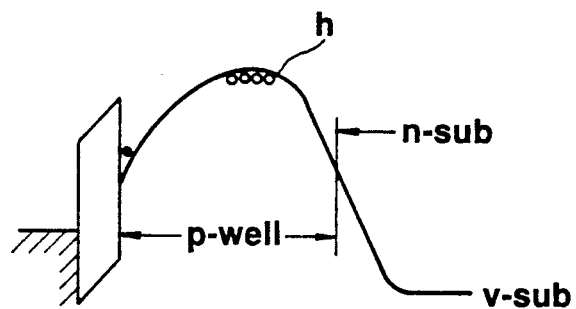
FIG. 6 shows the potential of an example of the prior art device.

The potential at the output circuit of the solid state imaging device of the above described illustrative embodiment is as shown in FIG. 3. Comparing this with the potential of the prior-art example shown in FIG. 6, the potential peak $P_O$ becomes low in height because of the low impurity concentration of the p-type well region 2. The potential peak $P_O$ also becomes shallow in depth because of the low depth of junction $x_1$ of the p-type well region 2. As a result, the holes h that exist in the conventional device at the potential peak may be eliminated, and the layer of the p-type well region 2 becomes depleted.

Figure 4:
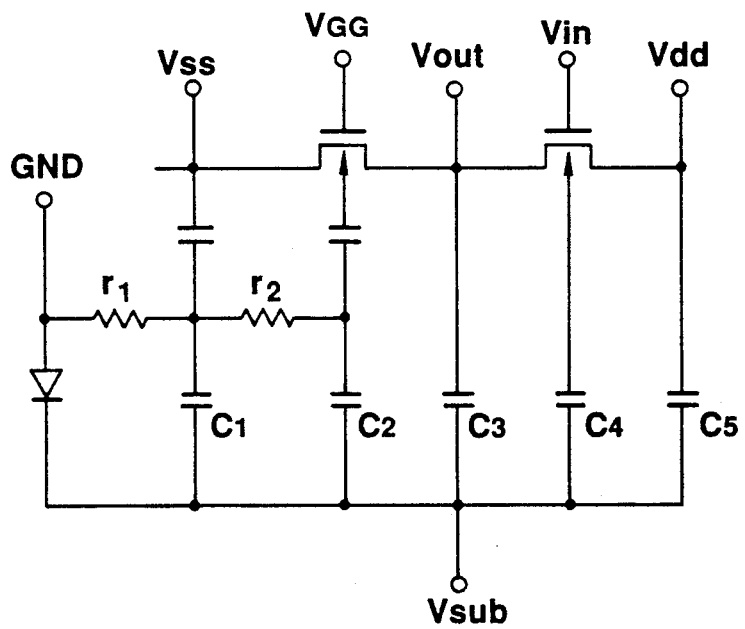
FIG. 4 shows an equivalent circuit corresponding to the cross-section of FIG. 1.
Figure 5:
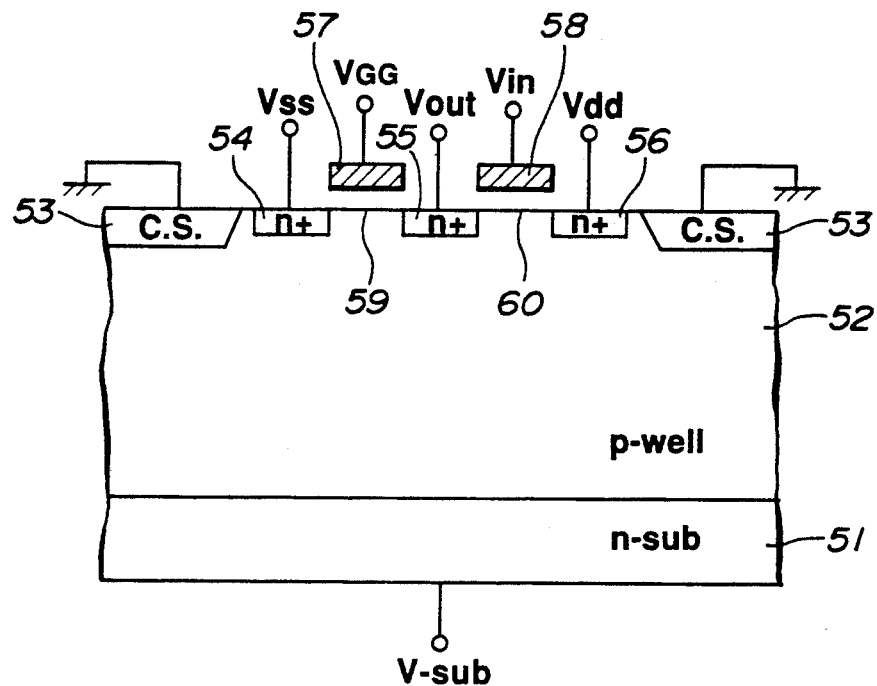
FIG. 5 is a schematic sectional view showing essential parts of an example of the conventional solid-state imaging device.
Figure 7:
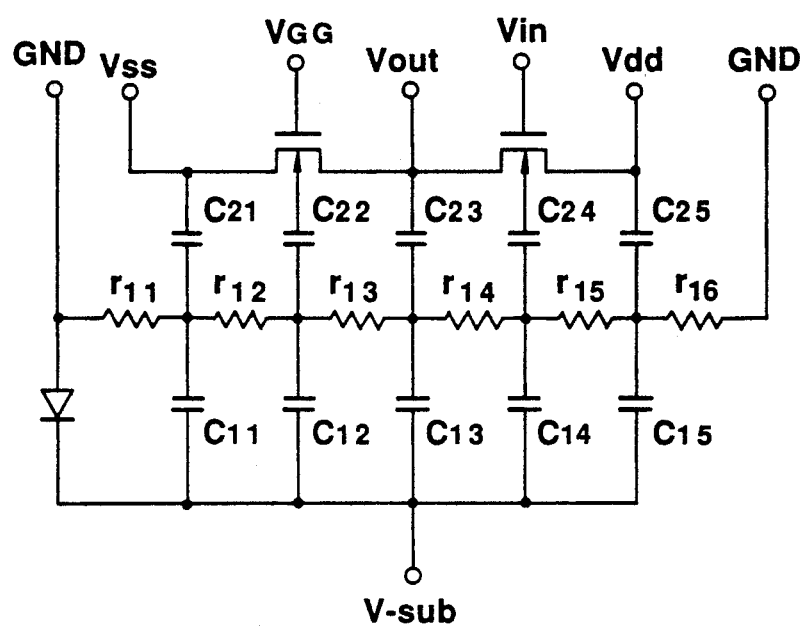
FIG. 7 shows an equivalent circuit corresponding to the cross-section of FIG. 5.

FIG. 4 shows an equivalent circuit for one source follower stage of the output circuit, which is similar to FIG. 7 showing the conventional device. As shown in this figure, the layer of the p-type well region 2 becomes partially depleted, so that the parasitic capacitances between the source drain regions 5, 6 and the parasitic capacitances between the p-type well region 2 and the n-type silicon substrate 1 are combined to form sole capacitances $C_3$ to $C_5$, while the resistances corresponding to the resistances $r_{13}$ to $r_{16}$ are eliminated. As a result, the time constant defined by the resistance and the capacitance is lowered and the substrate pulse exhibits satisfactory response at the time of electronic shuttering. Should the time constant be selected to be shorter than the period which elapsed since the application of the pulse voltage until the expiration of the blanking period, it becomes possible to suppress fluctuations in the gain or level of the driving MOS field effect transistor.

In the above described embodiment of the solid state imaging device, the well region 2 becomes completely depleted in the channel-forming region 9 and the source drain regions 5, 6 of the driving MOS field effect transistor of the output circuit. Also, in the p-type well region 2, directly below the source drain region 4, since the time constant defined by the resistances $r_1$, $r_2$ and the capacitances $C_1$, $C_2$ become shorter, it becomes possible to prevent the level or gain of the driving MOS field effect transistor from being fluctuated even when the pulse voltage is applied to the substrate at the time of the electronic shuttering operation.

Although the output circuit is of the source follower type in the above explained illustrative embodiment, it may also be of any circuit configuration. The p and n types may be reversed.

What is claimed is:

1. A solid state imaging device for carrying out electronic shuttering in a blanking period, comprising:
   a first conductivity type semiconductor substrate being applied a pulse voltage for electronic shuttering,
   a second conductivity type semiconductor region formed on said first conductivity type semiconductor substrate said second semiconductor region having an impurity concentration of $10^{15}$cm$^{-2}$ or lower and depth of junction in the order of 5μm such that the time constant defined by the resistance and the parasitic capacitance of said second conductivity semiconductor region is shorter than a period which elapses between the application of said pulse voltage until the expiration of the blanking period,
   an output circuit having a field effect transistor, and a channel of said field effect transistor formed in said second conductivity type semiconductor region.

2. The solid state imaging device according to claim 1, wherein
   said second conductivity type semiconductor region has such impurity concentration and depth of junction that the second conductivity type semiconductor region as a whole becomes a depleted layer.

3. The solid state imaging device according to claim 1 or 2, wherein
said first conductivity type is the n type and the second conductivity is the p type.

4. The solid state imaging device according to claims 1 or 2, wherein
said output circuit has a source follower configuration.

5. The solid state imaging device according to claim 3 wherein holes are not stored at a potential peak of the p-type semiconductor region.

* * * * *